(12) United States Patent
Chikugawa et al.

(10) Patent No.: US 7,282,740 B2
(45) Date of Patent: Oct. 16, 2007

(54) SEMICONDUCTOR LIGHT EMITTING DEVICE

(75) Inventors: Hiroshi Chikugawa, Kashihara (JP); Yoshihiko Yamamoto, Yamatokoriyama (JP); Eiji Kametani, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/013,617

(22) Filed: Dec. 15, 2004

(65) Prior Publication Data

US 2005/0133939 A1 Jun. 23, 2005

(30) Foreign Application Priority Data

Dec. 17, 2003 (JP) ............... 2003-419585

(51) Int. Cl.
*H01L 27/15* (2006.01)
(52) U.S. Cl. .............. 257/79; 257/13; 257/98; 257/99; 257/103; 257/433; 257/434; 257/704
(58) Field of Classification Search .......... 257/98, 257/790, 13, 99, 103, 433, 434, 704
See application file for complete search history.

(56) References Cited

U.S. PATENT DOCUMENTS

| 5,660,461 | A | * | 8/1997 | Ignatius et al. ............. 362/241 |
| 6,355,946 | B1 | * | 3/2002 | Ishinaga ....................... 257/98 |
| 6,376,902 | B1 | * | 4/2002 | Arndt ........................... 257/678 |
| 6,486,543 | B1 | * | 11/2002 | Sano et al. ................... 257/684 |
| 6,603,148 | B1 | * | 8/2003 | Sano et al. ................... 257/98 |
| 2002/0190262 | A1 | * | 12/2002 | Nitta et al. ................... 257/99 |
| 2003/0116769 | A1 | | 6/2003 | Song et al. |
| 2003/0168720 | A1 | * | 9/2003 | Kamada ....................... 257/666 |
| 2004/0188719 | A1 | * | 9/2004 | Nawashiro et al. ......... 257/200 |

FOREIGN PATENT DOCUMENTS

| JP | 2002-176203 | 6/2002 |
| JP | 2003-115615 | 4/2003 |
| JP | 2003-197974 | 7/2003 |

* cited by examiner

*Primary Examiner*—Zandra V. Smith
*Assistant Examiner*—Tsz Chiu
(74) *Attorney, Agent, or Firm*—Morrison & Foerster, LLP

(57) ABSTRACT

A light emitting element is die-bonded to a portion of a lead frame exposed at the bottom of an opening formed at a top face of a resin package. A reflector to direct light emitted from the light emitting element towards a predetermined direction is attached to the top face of the resin package. Lead terminals are arranged so as to protrude from two opposite side regions of the resin package. A predetermined lead terminal among the plurality of lead terminals, connected to a portion where the light emitting element is die-bonded, is bent upwards, and soldered to the reflector by solder paste.

2 Claims, 8 Drawing Sheets

SEMICONDUCTOR LIGHT EMITTING DEVICE

This nonprovisional application is based on Japanese Patent Application No. 2003-419585 filed with the Japan Patent Office on Dec. 17, 2003, the entire contents of which are hereby incorporated by reference.

BACKGROUND OF THE INVENTION

1. Field of the Invention

The present invention relates to semiconductor light emitting devices, and more particularly, to a semiconductor light emitting device including a light emitting element.

2. Description of the Background Art

In general semiconductor light emitting devices employed as the illumination device of a camera, the backlight of a liquid crystal display device, and the like, much current is conducted to achieve higher luminosity. However, a large current flow to the semiconductor light emitting device will cause increase of the temperature of the light emitting element per se, leading to poor light emitting efficiency to degrade the light emitting element in the worst case.

Therefore, measures to release the heat generated at the light emitting element outside efficiently in order to lower the temperature of the light emitting element have been adopted. One such measure is to increase the area or the thickness of the lead frame to which the light emitting element is die-bonded. Another known measure is to replace the material around the light emitting element with a material of high heat conductance.

In order to achieve high luminosity in the semiconductor light emitting device, the method of directing the light emitted from a light emitting element to a specified direction is employed. A resin lens or a reflector is attached to direct light towards the specified direction.

Additionally, a semiconductor light emitting device having the aforementioned measures combined is proposed to emit light of higher luminosity towards a specified direction. By way of example, one such semiconductor light emitting device disclosed in Japanese Patent Laying-Open No. 2003-115615 will be described hereinafter. Referring to FIG. 15, a light emitting element 103 and a reflector 105 are provided on the surface of a substrate 101. Two leads 104a and 104b of light emitting element 103 is soldered 107 to the wiring of substrate 101. A predetermined resin 109 is provided at the region of leads 104a and 104b and the region of reflector 105.

In this semiconductor light emitting device, leads 104a and 104b are brought into direct contact with resin 109 to achieve heat dissipation by allowing the heat generated at light emitting element 103 to be conducted to reflector 105 via resin 109.

Additionally, Japanese Patent Laying-Open Nos. 2002-176203 and 2003-197974 disclose a semiconductor light emitting device that achieves heat dissipation by conducting the heat generated at a light emitting element to a reflector via resin having high heat conductivity. The semiconductor light emitting device disclosed in Japanese Patent Laying-Open No. 2002-176203 has the reflector formed integrally with the lead to allow direct conduction of heat generated at the light emitting element to the reflector without the intervention of resin and the like.

The semiconductor light emitting devices set forth above had the following problems. If the heat generated at the light emitting element is to be conducted to a reflector via resin, the resin must be cured with the reflector fixed at a predetermined location with respect to the substrate and the light emitting element so as to achieve fixation between the reflector and the substrate. Therefore, a dedicated jig to position the reflector at predetermined site was required since heat conduction cannot be achieved efficiently if the position of the reflector is deviated. Furthermore, it was necessary to control the amount of resin during the fixation of the reflector so that the resin does not flow excessively to a region where resin is not required. In the case where the reflector and lead are formed integrally, the semiconductor light emitting device will have the reflector covered with mold resin since the reflector and lead are formed integrally from the beginning. Thus, there was the problem that heat cannot be released efficiently to the air from the reflector.

SUMMARY OF THE INVENTION

In view of the foregoing, an object of the present invention is to provide a semiconductor light emitting device that can achieve heat conduction reliably towards a reflector and that can release heat efficiently from the reflector to the air.

A semiconductor light emitting device according to the present invention includes a lead frame, a semiconductor light emitting element, a sealing member, and a reflector. The lead frame includes a plurality of lead terminals. The semiconductor light emitting element is die-bonded to the lead frame. The sealing member seals the lead frame such that each of the plurality of lead terminals and the semiconductor light emitting element are exposed. The reflector is attached to the sealing member to emit the light output by the semiconductor light emitting element towards one direction. A predetermined lead terminal among the plurality of lead terminals, connected to the region of the lead frame to which the semiconductor light emitting device is die-bonded, is arranged towards the side where the reflector is located to be connected to the reflector.

In accordance with such a configuration, a predetermined lead terminal connected to the region where the semiconductor light emitting device is die-bonded is connected to the reflector. Accordingly, the heat generated at the semiconductor light emitting element is reliably conducted to the reflector via the predetermined lead terminal. As a result, the heat conducted to the reflector can be released efficiently by the reflector.

In order to couple the reflector with the predetermined lead terminal by, for example, attachment, the reflector preferably includes an attach region to attach the predetermined lead terminal. Particularly, it is desirable that the predetermined lead terminal is fixed to the reflector by a conductive material.

The sealing member is formed having side regions facing each other. When the plurality of lead terminals are respectively arranged so as to protrude from the sealing member along one of the side regions facing each other, the predetermined lead terminal is preferably arranged at one end of the plurality of lead terminals respectively disposed along one of the side regions.

Accordingly, the predetermined lead terminal can be bent towards the region of the sealing member where the reflector is disposed without covering the semiconductor light emitting element exposed at the sealing member. The area of connection between the reflector and the predetermined lead terminal can be ensured to allow the reflector to be supported and fixed more stably.

Furthermore, in the case where there is another predetermined lead terminal connected to the portion of the lead frame to which the semiconductor light emitting element is die-bonded, that another predetermined lead terminal is preferably arranged at the other end of the plurality of lead terminals respectively disposed along one side region.

Accordingly, the predetermined lead terminal and the another predetermined lead terminal connected to the reflector are disposed such that the distance therebetween is greatest. As a result, the reflector can be supported and fixed more stably by the predetermined lead terminal and the another predetermined lead terminal.

In the above-described case where the lead frame includes another predetermined lead terminal connected to the region of the lead frame to which the semiconductor light emitting element is die-bonded, the sealing member includes side regions facing each other, and the predetermined lead terminals are arranged so as to protrude from the sealing member along respective side regions facing each other, the predetermined lead terminal and the another predetermined lead terminal are preferably disposed at a position where the distance between the predetermined lead terminal and the another predetermined lead terminal is greatest.

Accordingly, the reflector is supported and fixed more stably through the predetermined lead terminal and the another predetermined lead terminal by virtue of the predetermined lead terminal and another predetermined lead terminal connected to the reflector such that the distance between these lead terminals is greatest.

There is further provided a groove at a region of the sealing member where the reflector is located to receive the predetermined lead terminal. The depth of the groove is preferably set such that the surface of the predetermined lead terminal and the surface of the sealing member where the reflector is located is substantially on the same plane as the predetermined lead terminal received in the groove.

By setting the top face of the predetermined lead terminal substantially flush with the top face of the sealing member, the reflector is brought into contact with the sealing member in addition to the predetermined lead terminal. As a result, the reflector can be supported and fixed further stably by the predetermined lead terminal and sealing member.

Alternatively, the reflector can be formed by folding and bending a member that becomes the reflector. This member is formed integrally with the predetermined lead terminal in an unfolded manner, corresponding to an expansion plan.

In this case, the step of coupling the predetermined lead terminal with the reflector is no longer required. Since the reflector is formed integrally with the leading end of the predetermined lead terminal, the reflector can be supported reliably by the predetermined lead terminal.

Such a member to constitute a reflector specifically includes a reflector body and another reflector body, a projection provided at one of the reflector body and the another reflector body, and a notch provided at the other of the reflector body and the another reflector body. In the reflector, the projection preferably engages with the notch.

In the case where the reflector is provided as a separate piece without being formed integrally with the leading end of the predetermined lead terminal, the degree of freedom of the configuration of the reflector is increased. For example, in the case where there is another sealing member that seals another lead frame to which another semiconductor light emitting element is die-bonded, the reflector can be disposed so as to bridge between the sealing member and the another sealing member.

Furthermore, the reflector preferably includes at least one of a flat portion and a curved portion as the region to reflect light from the standpoint of improving the degree of freedom of light reflection.

Specifically, a reflector can be used having a reflection plane whose configuration in cross section parallel to the optical axis is formed of a straight line, or a reflection plane whose configuration in cross section parallel to the optical axis is formed of a curve constituting a parabola, a portion of an ellipse, or an arc. Furthermore, a reflector can be used whose configuration in plane in a direction substantially orthogonal to the optical axis is a rectangle, a shape formed of two arcs and a straight line connecting these arcs, a shape corresponding to a portion of the curve of an ellipse or a parabola being partially coupled, or the like.

In order to release heat efficiently from the reflector to the air, preferably the entire reflector is exposed to the air.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
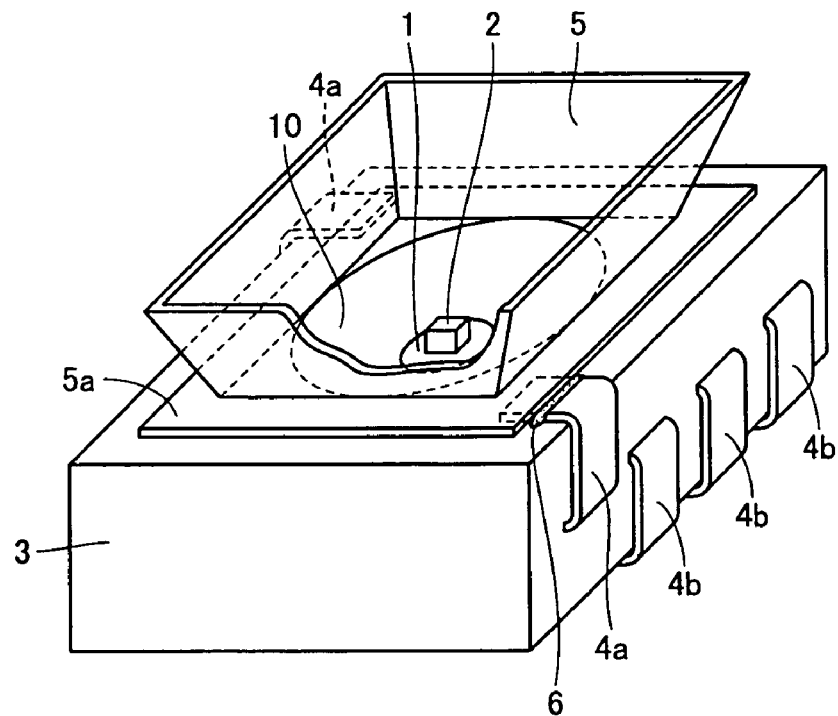
FIG. 1 is a perspective view of a semiconductor light emitting device according to a first embodiment of the present invention.
Figure 2:
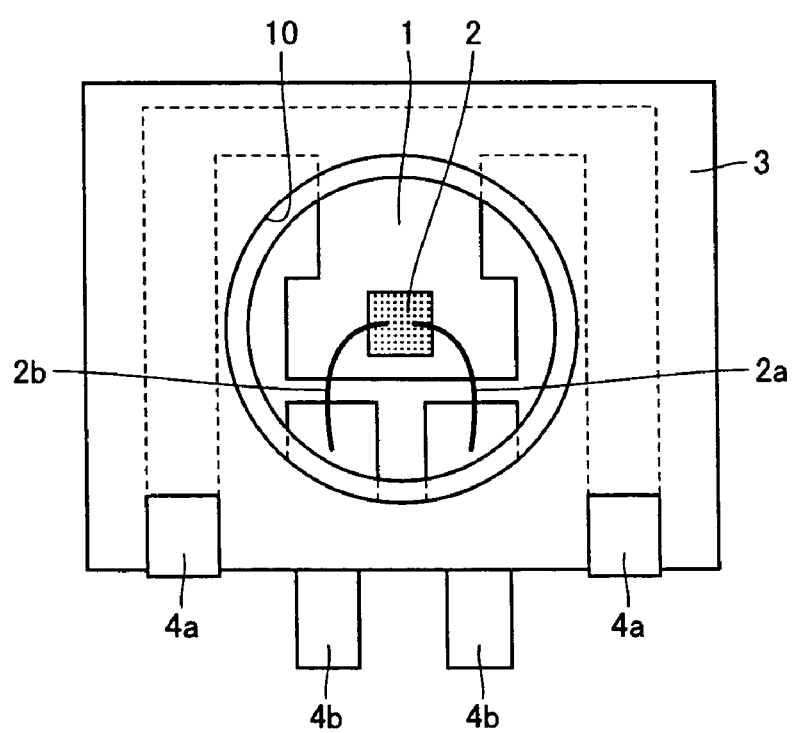
FIG. 2 is a plan view of a modification of the semiconductor light emitting device of the first embodiment.

Referring to FIGS. 1 and 2, a semiconductor light emitting device according to a first embodiment of the present invention has an opening 10 formed at a top face of a resin package 3. A light emitting element 2 is die-bonded to a region of a lead frame 1 exposed at the bottom of opening 10. At a top face of resin package 3, a reflector 5 is attached to direct the light emitted by the light emitting element 2 towards a predetermined direction. Reflector 5 is attached such that its entirety is exposed to the air.

Respective lead terminals 4a and 4b of lead frame 1 are disposed so as to project from each of the two opposite side regions of resin package 3. Among the plurality of lead terminals 4a and 4b, a predetermined lead terminal 4a connected to the region where light emitting element 2 is die-bonded is bent upward. The leading end of the bent lead terminal 4a is soldered by, for example, solder paste 6 to a fringe portion identified as an attach region 5a of reflector 5. The remaining lead terminals 4b are respectively bent downwards for connection to the wiring (not shown) formed at the substrate. Lead terminal 4b is electrically connected to light emitting element 2 via leads 2a and 2b.

The two lead terminals 4a connected to reflector 5 are disposed diagonally opposite to each other at resin package 3 such that the distance between these two lead terminals is greatest.

In the above-described semiconductor light emitting device, lead terminal 4a connected to the region where light emitting element 2 is die-bonded is connected to reflector 5. Accordingly, the heat generated at light emitting element 2 is reliably conducted to reflector 5 via lead terminal 4a. The heat conducted to reflector 5 is released efficiently to the air by reflector 5 that is entirely exposed to the air.

By the efficient dissipation of heat generated at light emitting element 2 through reflector 5, a relatively large current can be conducted to light emitting element 2 to allow increase of the luminosity. Furthermore, temperature increase of the light emitting element is suppressed to improve the reliability of light emitting element 2. Additionally, degradation of light emitting element 2 can be suppressed.

The two lead terminals 4a connected to reflector 5 are disposed on the diagonal of resin package 3. Accordingly, reflector 5 is supported by lead terminals 4a disposed such that the distance therebetween is greatest. As a result, reflector 5 can be supported and fixed more stably by the lead terminals 4a.

The present embodiment was described based on an example where lead terminal 4a and reflector 5 are connected by solder paste 6. Alternatively, appropriate conductive paste such as silver (Ag) paste can be used. The conductive paste has high heat conduction by the inclusion of metal particles.

The foregoing semiconductor light emitting device is described based on an example where respective lead terminals 4a and 4b are disposed projecting from two opposite side regions of resin package 3. Alternatively, the semiconductor light emitting device may have the lead terminals respectively disposed so as to protrude from only one of the side regions of the resin package.

In this case, the two lead terminals 4a connected to reflector 5 are preferably disposed at one end and the other end such that the distance between these two lead terminals is greatest. Accordingly, reflector 5 can be supported and fixed more stably by the two lead terminals 4a.

The number of lead terminals connected to the reflector is not limited to two; and three or more, or only one can be provided. Particularly in the case where only one lead terminal is connected to the reflector, the endmost lead terminal is preferably connected to the reflector. Accordingly, the lead terminal can be bent up towards the top face of the resin package while opening 10 (refer to FIG. 1) provided at the top face of resin package 3 is not covered. The reflector can be supported and fixed more stably while ensuring a connecting area between the reflector and lead terminal.

Second Embodiment

A semiconductor light emitting device according to a second embodiment of the present invention is directed to fixing the reflector more stably to the resin package.

Figure 3:
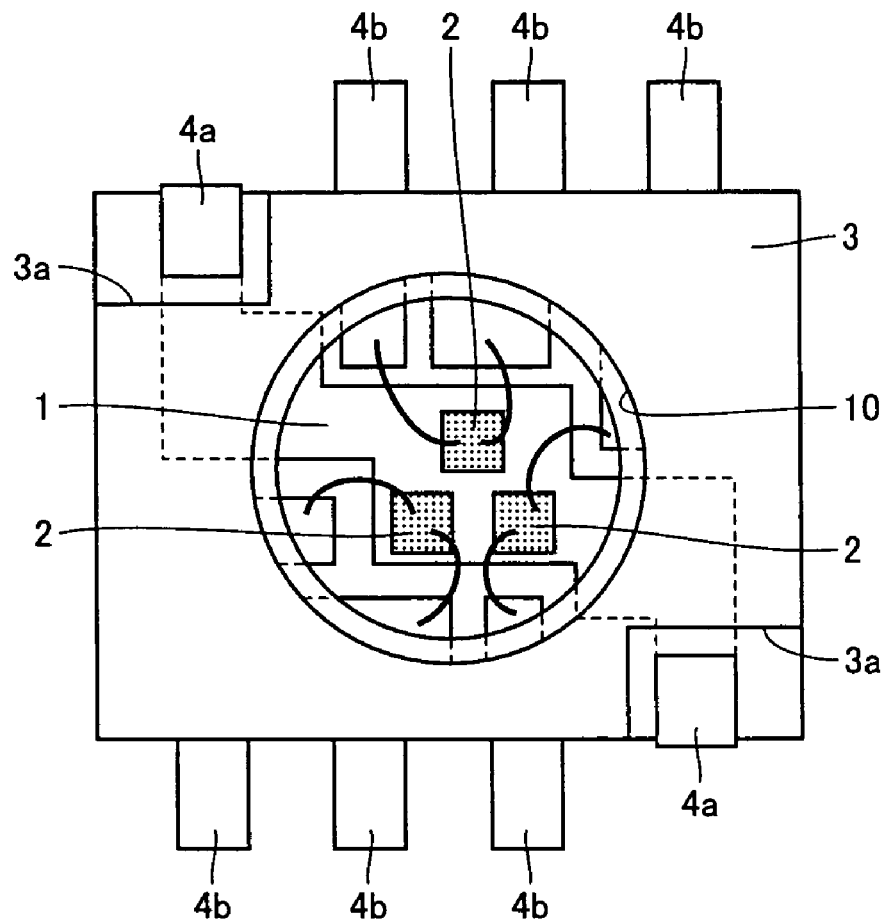
FIG. 3 is a plan view of a semiconductor light emitting device according to a second embodiment of the present invention.
Figure 4:
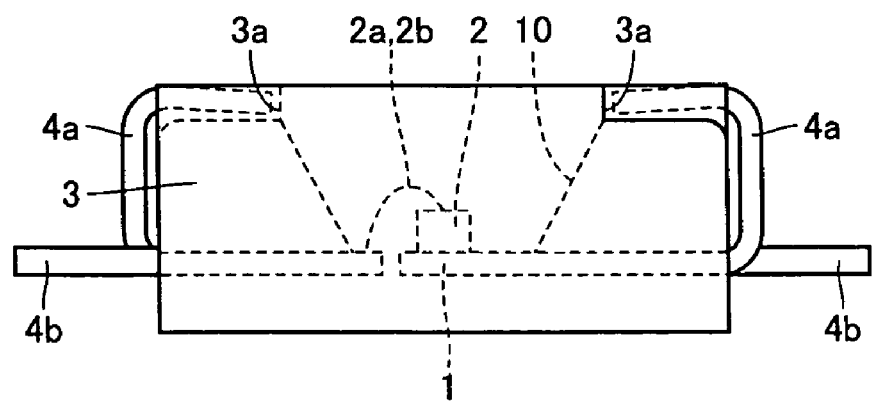
FIG. 4 is a side view of the semiconductor light emitting device of FIG. 3.

Referring to FIGS. 3 and 4, a groove 3a is formed in advance at the top face of resin package 3 such that the top plane of lead terminal 4a is substantially flush with the top face of resin package 3 with lead terminal 4a connected to reflector 5 (refer to FIG. 1) in a bending status. The remaining configuration of the semiconductor light emitting device of the second embodiment is similar to the semiconductor light emitting device shown in FIG. 1. Therefore, the same elements have the same reference characters allotted, and description thereof will not be repeated.

In the semiconductor light emitting device of the second embodiment, lead terminal 4a connected to reflector 5 is received in groove 3a provided at the top face of resin package 3 by being bent towards the top face of resin package 3. Accordingly, the top face of lead terminal 4a is substantially flush with the top face of resin package 3, so that reflector 5 is brought into contact with the top face of resin package 3 in addition to lead terminal 4a. As a result, reflector 5 is supported and fixed further stably by both the top faces of lead terminal 4a and resin package 3, as compared to the foregoing semiconductor light emitting device.

In the semiconductor light emitting device of the second embodiment, lead terminal 4a in a bent status will not protrude above the top face of resin package 3. Therefore, the semiconductor light emitting device prior to attachment of a reflector can be handled easier.

Third Embodiment

Figure 5:
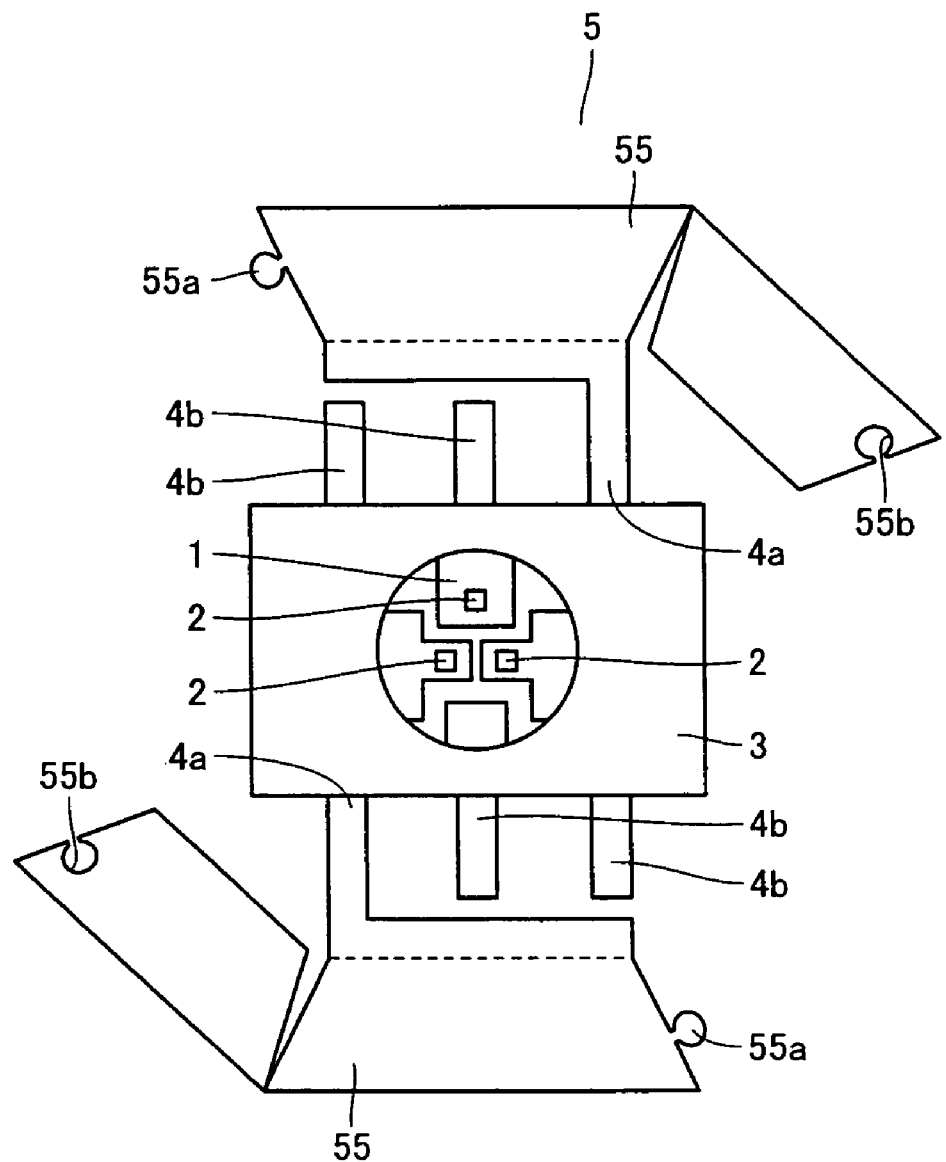
FIG. 5 is an exploded plan view of a semiconductor light emitting device according to a third embodiment of the present invention.

A semiconductor light emitting device according to a third embodiment of the present invention has a reflector formed integrally with the lead frame. Referring to FIG. 5, a portion to become reflector 5 is formed integrally with the leading end of lead terminal 4a. This portion to become the reflector is formed in a state (shape) in which the reflector is spread out in an unfolded manner corresponding to an expansion plan, including four reflector bodies 55 in the present embodiment.

A projection 55a is provided at one of adjacent reflector bodies 55. A notch 55b to be engaged with projection 55a is provided at the other of the adjacent reflector bodies 55.

Figure 6:
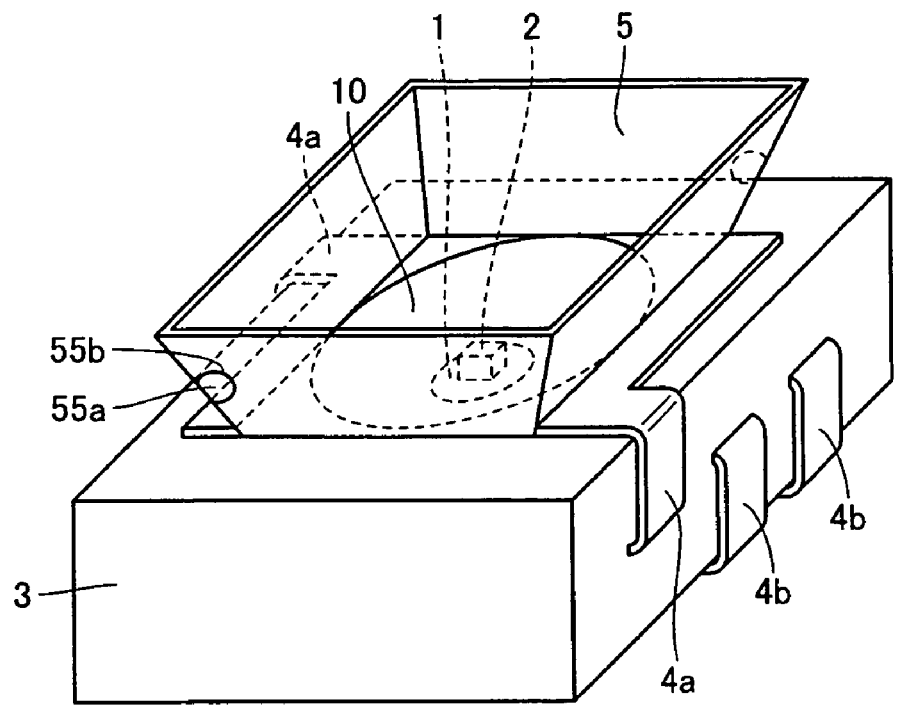
FIG. 6 is a perspective view of the semiconductor light emitting device of FIG. 5 of the third embodiment.

By bending each reflector body 55 and holding projection 55a of reflector body 55 under engagement with notch 55b of an adjacent reflector body 55, reflector 5 is assembled. A semiconductor light emitting device having reflector 5 at the top face of resin package 3 is obtained, as shown in FIG. 6. The remaining elements are similar to those of the semiconductor light emitting device of FIG. 1. Therefore, corresponding elements have the same reference characters allotted, and description thereof will not be repeated.

In the semiconductor light emitting device of the third embodiment, the portion to become reflector 5 is formed integrally with the leading end of lead terminal 4a, taking a configuration in which reflector 5 is spread out in an unfolded manner corresponding to an expansion plan. Therefore, the step of connecting lead terminal 4a with reflector 5 is not longer necessary. Assembly of the portions constituting the reflector leads to a state where reflector plate 5 is attached integrally to the leading end of lead terminal 4a. As a result, reflector 5 is reliably supported and fixed to lead terminal 4a.

Since reflector plate 5 and lead terminal 4a are connected integrally, higher heat conduction is achieved, as compared to the case where the reflector plate is attached to the lead terminal. Thus, heat dissipation can be effected more efficiently.

The semiconductor light emitting device set forth above was described based on an example having a flat reflection plane for the reflector. Alternatively, a reflector having a curved reflection plane can be employed depending upon the shape in which the reflector is spread out in an unfolded manner and the assembly by, for example a bending process.

Fourth Embodiment

Figure 7:
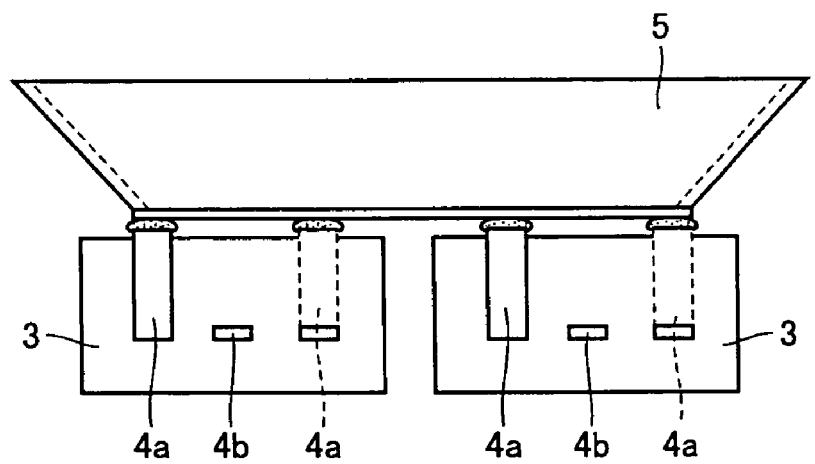
FIG. 7 is an exploded plan view of a semiconductor light emitting device according to a fourth embodiment of the present invention.

A semiconductor light emitting device including a plurality of resin packages in which a light emitting element is incorporated will be described here as a semiconductor light emitting device of the fourth embodiment. Referring to FIG. 7, reflector 5 is disposed so as to bridge across two resin packages 3. A lead terminal 4a connected to the portion where a light emitting element (not shown) is die-bonded is connected to reflector 5, likewise the semiconductor light emitting device described above.

By providing reflector 5 separately from the lead frame in the semiconductor light emitting device set forth above, the degree of freedom for attaching reflector 5 becomes higher. One reflector 5 can be attached with respect to two resin packages 3. Since lead terminal 4a coupled to the region where light emitting element 2 is die-bonded is connected, the heat generated at light emitting element 2 can be released efficiently by reflector 5. As a result, the heat conducted to reflector 5 can be released efficiently through reflector 5.

The above embodiment was described based on an example in which one reflector 5 is provided for two resin packages 3. The number of resin packages 3 is not limited to two. A semiconductor light-emitting device having one reflector arranged for three or more resin packages can be provided.

Figure 8:
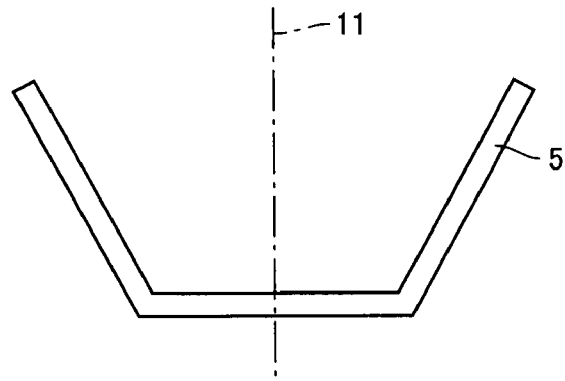
FIGS. 8, 9 and 10 are sectional views of the semiconductor light emitting device of respective embodiments, representing examples of the configuration of the cross section of the reflector.
Figure 9:
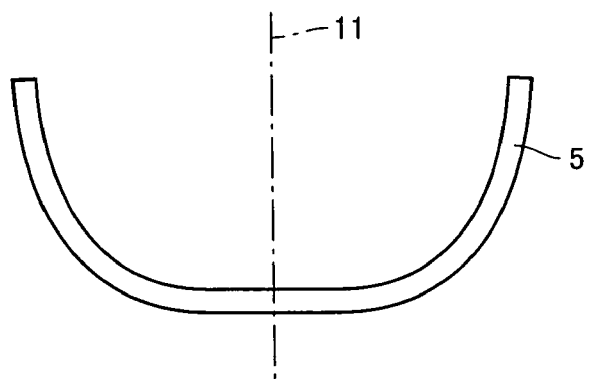
Figure 10:
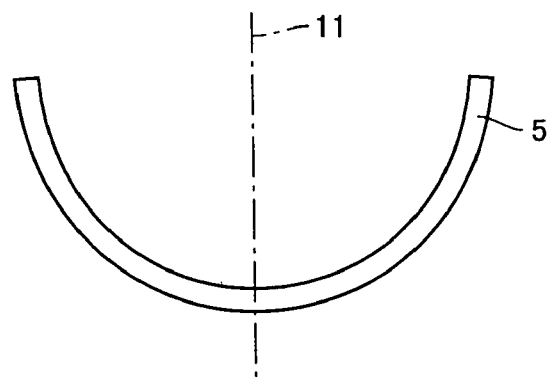

The semiconductor light emitting devices of respective embodiments set forth above were described based on an example in which reflector 5 has a reflection plane whose configuration in cross section along an optical axis 11 is formed of a straight line, as shown in FIG. 8. Additionally, a reflector 5 having a reflection plane whose configuration in cross section is formed of a curve constituting a parabola or a portion of an ellipse can be disposed at the resin package, as shown in FIG. 9. Alternatively, a reflector 5 having a reflection plane whose configuration in cross section is formed of a curve constituting an arc can be disposed at the resin package, as shown in FIG. 10.

Figure 11:
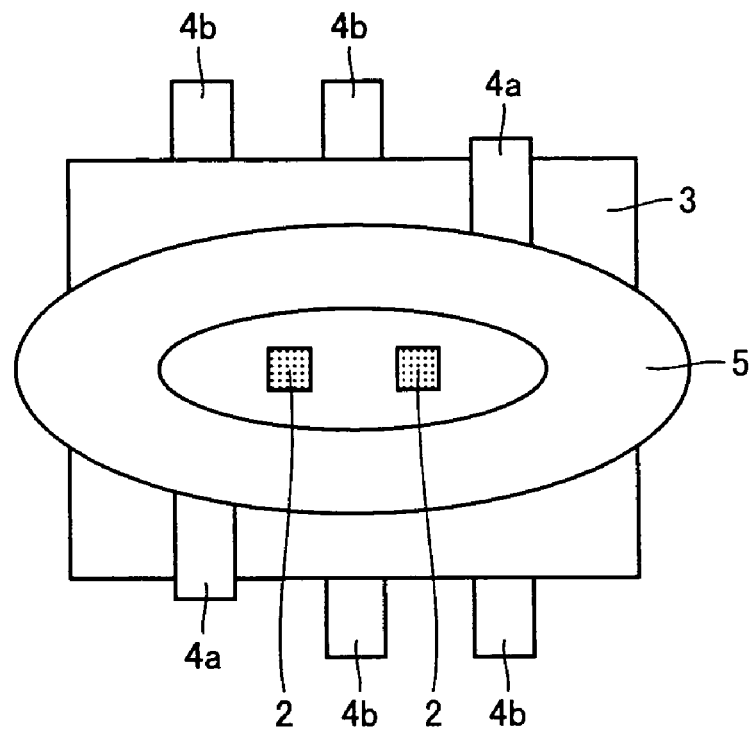
FIGS. 11, 12, 13 and 14 are sectional views of the semiconductor light emitting device of respective embodiments, representing examples of the configuration of the plane of the reflector.

The semiconductor light emitting devices of respective embodiments set forth above were described based on an example in which reflector 5 whose configuration in plane in a direction substantially orthogonal to the optical axis is a rectangle. Additionally, in the case where two light emitting elements 2 are arranged, a reflector 5 whose configuration in plane in a direction substantially orthogonal to the optical axis is an ellipse with a major axis set along the direction where the two light emitting elements are arranged can be disposed at resin package 3, as shown in FIG. 11.

Figure 12:
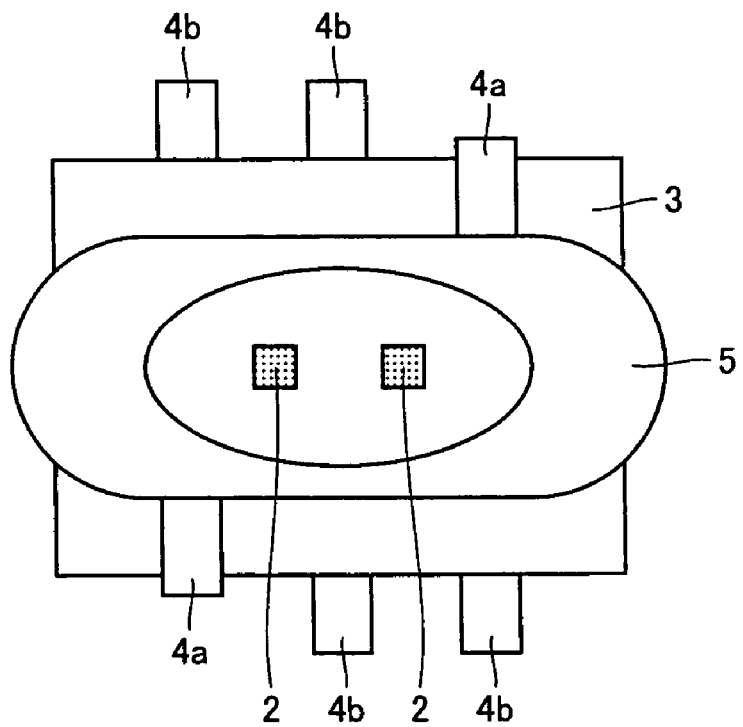
Figure 13:
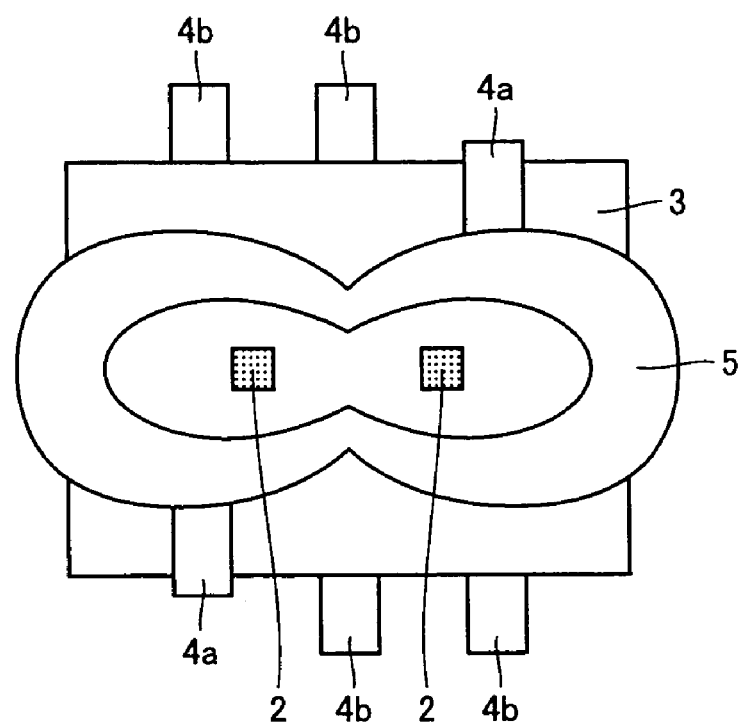

Furthermore, a reflector 5 whose configuration in plane takes a shape formed of two arcs and a straight line connecting these arcs can be disposed at resin package 3, as shown in FIG. 12. Alternatively, a reflector 5 whose configuration in plane takes a shape corresponding to a portion of the curve of an ellipse, a parabola or the like being coupled, can be disposed at resin package 3, as shown in FIG. 13.

Figure 14:
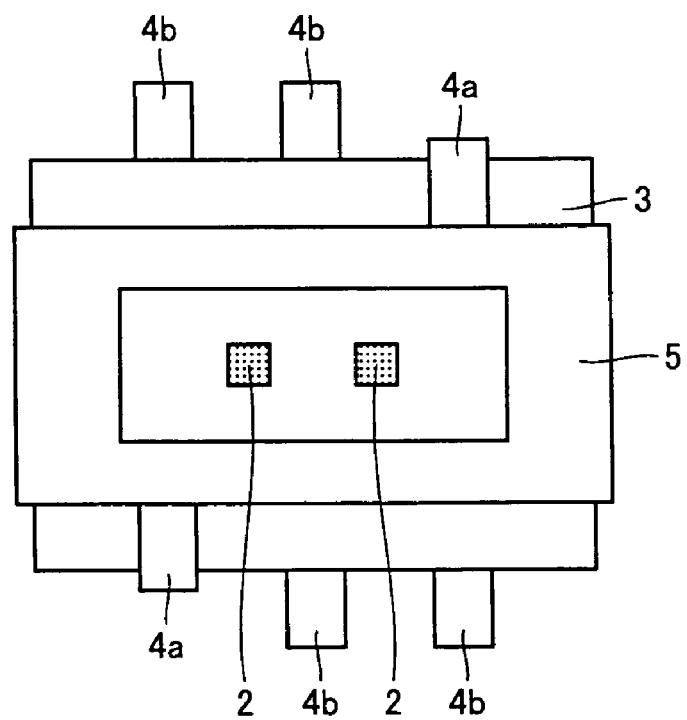
Figure 15:
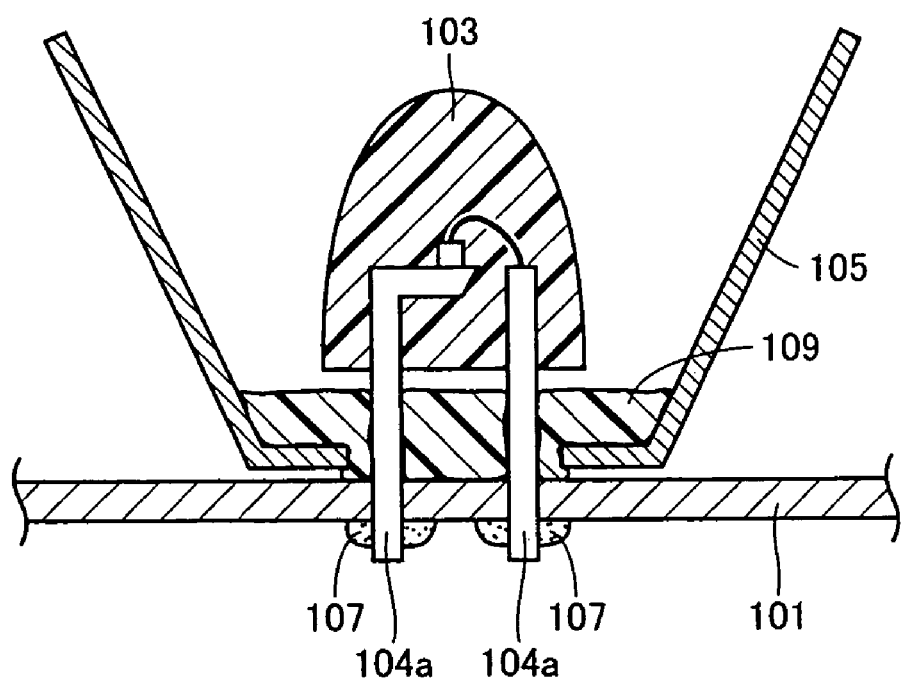
FIG. 15 is a sectional view of a conventional semiconductor light emitting device.

In a reflector whose configuration in plane in a direction substantially orthogonal to the optical axis is a rectangle, the four sheet-like reflection planes are preferably disposed in an inclined manner such that each spreads upwards, as shown in FIG. 14. Accordingly, light emitted from the light emitting element can be output efficiently in one direction.

By providing the reflector as a separate piece with respect to the lead frame, the shape of the reflector can be selected in accordance with the semiconductor light emitting device. The degree of freedom of the emission property of light output from the light emitting element becomes higher. Furthermore, with regards to a common semiconductor light emitting device prior to attachment of a reflector, various reflectors can be applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:
   a lead frame including a plurality of lead terminals,
   a semiconductor light emitting element die-bonded to said lead frame,
   a sealing member sealing said lead frame such that each of said plurality of lead terminals and said semiconductor light emitting element are exposed, and
   a reflector attached to said sealing member to direct light emitted by said semiconductor light emitting element towards one direction,
   wherein a predetermined lead terminal among said plurality of lead terminals is arranged towards a side where said reflector is located and connected to said reflector, said predetermined lead terminal being connected to a portion of said lead frame to which said semiconductor light emitting element is die-bonded,
   wherein said reflector is formed by bending a member to become said reflector, formed integrally with said predetermined lead terminal in a state in which the reflector is spread out in an unfolded manner corresponding to an expansion plan.

2. The semiconductor light emitting device according to claim 1, wherein said member to become a reflector comprises
   a reflector body and another reflector body,
   a projection provided at one of said reflector body and said another reflector body, and
   a notch provided at the other of said reflector body and said another reflector body,
   said projection being engaged with said notch at said reflector.

* * * * *